US012787255B2

(12) United States Patent
Kim et al.

(10) Patent No.: US 12,787,255 B2
(45) Date of Patent: Nov. 3, 2026

(54) BURIED-TRENCH DUAL METAL-NITRIDE GATE SEMICONDUCTOR DEVICE AND METHOD FOR FABRICATING THE SAME

(71) Applicant: SK hynix Inc., Gyeonggi-do (KR)

(72) Inventors: Dong Soo Kim, Gyeonggi-do (KR); Mun Gi Sim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 718 days.

(21) Appl. No.: 17/993,473

(22) Filed: Nov. 23, 2022

(65) Prior Publication Data

US 2023/0403844 A1 Dec. 14, 2023

(30) Foreign Application Priority Data

Jun. 14, 2022 (KR) ........................ 10-2022-0072257

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC .... H10B 12/053; H10B 12/34; H10B 12/488; H10D 64/513; H10D 64/667
See application file for complete search history.

(56) References Cited

U.S. PATENT DOCUMENTS 10,741,643 B2 8/2020 Ryu
10,748,905 B2 8/2020 Lee et al.
2011/0260242 A1* 10/2011 Jang ........................ H10D 64/01 438/270
2018/0174845 A1* 6/2018 Jang ................. H10D 64/01318
(Continued)

FOREIGN PATENT DOCUMENTS

KR 10-2015-0137428 A 12/2015
KR 10-2018-0130189 A 12/2018
(Continued)

OTHER PUBLICATIONS

Qiuxia Xu et al., Ion-Implanted TiN Metal Gate With Dual Band-Edge Work Function and Excellent Reliability for Advanced CMOS Device Applications, IEEE Transactions on Electron Devices, vol. 62, No. 12, Dec. 2015, pp. 4199-4205.
(Continued)

*Primary Examiner* — Nelson Garces
(74) *Attorney, Agent, or Firm* — IP&T GROUP LLP

(57) ABSTRACT

Embodiments of the present invention provides a semiconductor device with improved electrical characteristics and a method of fabricating the same. A semiconductor device according to an embodiment of the present invention comprises: a substrate including a trench; a gate dielectric layer formed along a sidewall surface and a bottom surface of the trench; a lower gate electrode filling a lower portion of the trench over the gate dielectric layer and formed of a first metal nitride, the first metal nitride having a first grain size; an upper gate electrode partially filling the trench over the lower gate electrode, including a low work function control element, and formed of a second metal nitride, the second metal nitride having a second grain size bigger than the first grain size; and a capping layer gap-filling the remainder of the trench over the upper gate electrode.

16 Claims, 8 Drawing Sheets

(56) References Cited

U.S. PATENT DOCUMENTS

| | | | | |
|---|---|---|---|---|
| 2018/0331111 | A1* | 11/2018 | Lee | H10B 12/34 |
| 2021/0082767 | A1* | 3/2021 | Kim | H10D 64/513 |
| 2022/0005697 | A1* | 1/2022 | Hsu | H10D 30/024 |
| 2023/0006050 | A1* | 1/2023 | Park | H10D 64/66 |

FOREIGN PATENT DOCUMENTS

| | | | |
|---|---|---|---|
| KR | 10-2019-0010805 | A | 1/2019 |
| KR | 10-2020-0144179 | A | 12/2020 |

OTHER PUBLICATIONS

Office Action for Korean Patent Application No. 10-2022-0072257 issued by the Korean Patent Office on Dec. 12, 2025.

* cited by examiner

BURIED-TRENCH DUAL METAL-NITRIDE GATE SEMICONDUCTOR DEVICE AND METHOD FOR FABRICATING THE SAME

CROSS-REFERENCE TO RELATED APPLICATIONS

The present application claims priority to Korean Patent Application No. 10-2022-0072257, filed on Jun. 14, 2022, which is incorporated herein by reference in its entirety.

BACKGROUND

1. Field

The present invention relates generally to a semiconductor device and, more particularly, to a semiconductor device having a buried gate and to a method for fabricating the same.

2. Description of the Related Art

As the electronics industry continues to develop rapidly, demand for higher integration of the semiconductor devices is increasing. Accordingly, various problems, such as a decrease in a process margin of an exposure process for defining fine patterns, occur, making it increasingly more difficult to implement higher integration semiconductor devices. In addition, with the development of the electronics industry, demand for high-speed semiconductor devices is also increasing. Hence, various studies are currently underway to develop improved semiconductor devices that satisfy the demands for higher integration and/or higher speed.

SUMMARY

The present embodiments provide a semiconductor device providing enhanced integration and improved electrical characteristics including improved speed. The present embodiments also provide a method for manufacturing the same.

According to an embodiment of the present invention, a semiconductor device comprises: a substrate including a trench; a gate dielectric layer formed along a sidewall surface and a bottom surface of the trench; a lower gate electrode filling a lower portion of the trench over the gate dielectric layer and formed of a first metal nitride, the first metal nitride having a first grain size; an upper gate electrode partially filling the trench over the lower gate electrode, including a low work function control element, and formed of a second metal nitride, the second metal nitride having a second grain size bigger than the first grain size; and a capping layer gap-filling the remainder of the trench over the upper gate electrode.

According to some embodiments of the present invention, a semiconductor device comprises: a substrate including a gate trench; a gate dielectric layer formed along a sidewall surface and a bottom surface of the gate trench; a lower gate electrode filling a lower portion of the gate trench over the gate dielectric layer and formed of a first metal nitride, the first metal nitride having a first grain size and containing silicon; an upper gate electrode partially filling the gate trench over the lower gate electrode, including a low work function control element, and formed of a second metal nitride, the second metal nitride having a lower silicon content than a silicon content of the first metal nitride; and a capping layer gap-filling the remainder of the gate trench over the upper gate electrode.

According to some embodiments of the present invention, a semiconductor device comprises: a substrate including a gate trench; a gate dielectric layer formed along a sidewall surface and a bottom surface of the gate trench; a lower gate electrode filling a bottom part of the gate trench over the gate dielectric layer and formed of a first metal nitride containing silicon; an upper gate electrode filling a part of the gate trench over the lower gate electrode and formed of a second metal nitride containing a silicon-free low work function control element; and a capping layer gap-filling the reminder of the gate trench over the upper gate electrode.

According to an embodiment of the present invention, a method of fabricating a semiconductor device comprises: forming a gate trench in a substrate; forming a gate dielectric layer along a sidewall surface and a bottom surface of the gate trench; forming a lower gate electrode filling a lower portion of the gate trench over the gate dielectric layer and formed of a first metal nitride, the first metal nitride having a first grain size; forming an upper gate electrode including a low work function control element over the lower gate electrode and formed of a second metal nitride, the second metal nitride having a second grain size bigger than the first grain size; and forming a capping layer gap-filling the remainder of the gate trench over the upper gate electrode.

This technology can reduce gate induced drain leakage (GIDL) by forming the gate electrode overlapping the source/drain region with a low work function layer.

These and other features and advantages of the present invention will become apparent to the skilled person from the detailed description and the following drawings.

BRIEF DESCRIPTION OF THE DRAWINGS

FIGS. 3A to 31 are diagrams illustrating an embodiment of a method of forming the semiconductor device according to the first embodiment.

DETAILED DESCRIPTION

Figure 1:
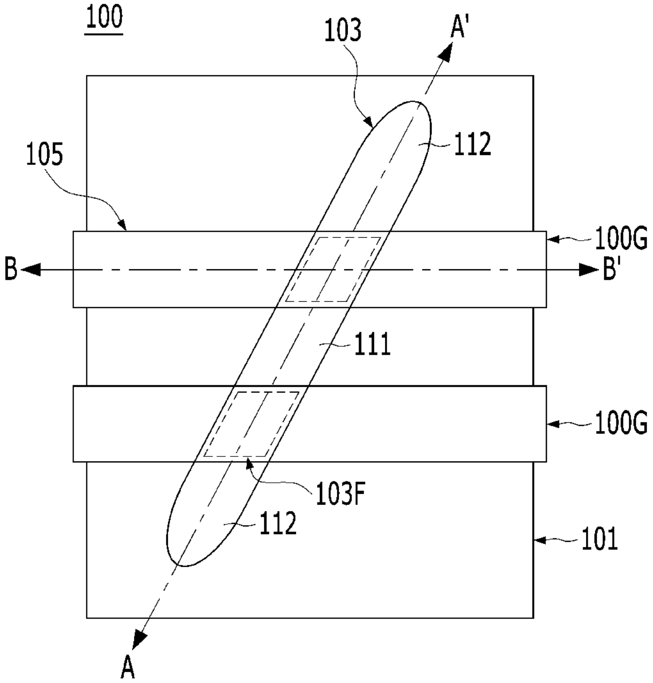
FIG. 1 is a plan view of a semiconductor device according to an embodiment of the present invention.

Embodiments described herein will be described with reference to cross-sectional, plan and block diagrams, which are ideal schematic diagrams of the present invention. Accordingly, the shapes shown in the illustrative drawings may be modified due to fabricating technology and/or tolerance. Accordingly, the embodiments of the present invention are not limited to the specific shapes shown, but also include changes in the shapes caused by the fabricating process. Accordingly, the regions illustrated in the drawings have schematic properties, and the shapes of the regions illustrated in the drawings are intended to illustrate specific shapes of regions of the device, and not to limit the scope of the invention. Sizes and relative sizes of components shown in the drawings may be exaggerated for clarity of description. Like reference numerals refer to like elements throughout this disclosure. "And/or" includes each and every combination of one or more of the recited items.

Reference to an element or layer "on" another element or layer includes not only the case where an element or layer is directly on another element or layer, but also the case where intervening layers or elements exists between an element or layer and another element or layer. The terminology used herein is for the purpose of describing the embodiments and is not intended to limit the present invention. In this specification, the singular also includes the plural unless specifically stated otherwise in the phrase.

Hereinafter, in embodiments, a threshold voltage (Vt) depends on a flat-band voltage (VFB). The flat band voltage VFB depends on a work function. The work function can be engineered by various methods. For example, the work function may be controlled by the material of the gate electrode, the material between the gate electrode and the channel, and the like. By increasing or decreasing the work function, the flat band voltage can be shifted. The high work function may shift the flat band voltage in a positive direction, and the low work function may shift the flat band voltage in a negative direction. As described above, the threshold voltage can be adjusted by shifting the flat band voltage. In embodiments, the flat band voltage may be lowered by the low work function material, thereby improving the gate induced drain leakage (GIDL).

Hereinafter, in embodiments, a buried gate structure may be located in the gate trench. The buried gate structure may include a gate electrode. The gate electrode may fill the gate trench. Accordingly, the gate electrode may be referred to as a 'buried gate electrode'. The gate electrode may include a lower gate electrode and an upper gate electrode. The lower gate electrode may fill a lower portion of the gate trench, and the upper gate electrode may fill an upper portion of the gate trench over the lower gate electrode. As described above, the gate electrode may be a dual gate electrode in which the upper gate electrode is positioned on the lower gate electrode. The lower gate electrode may overlap the channel. The upper gate electrode may overlap the first and second source/drain regions (i.e., source/drain regions).

Figure 2A:
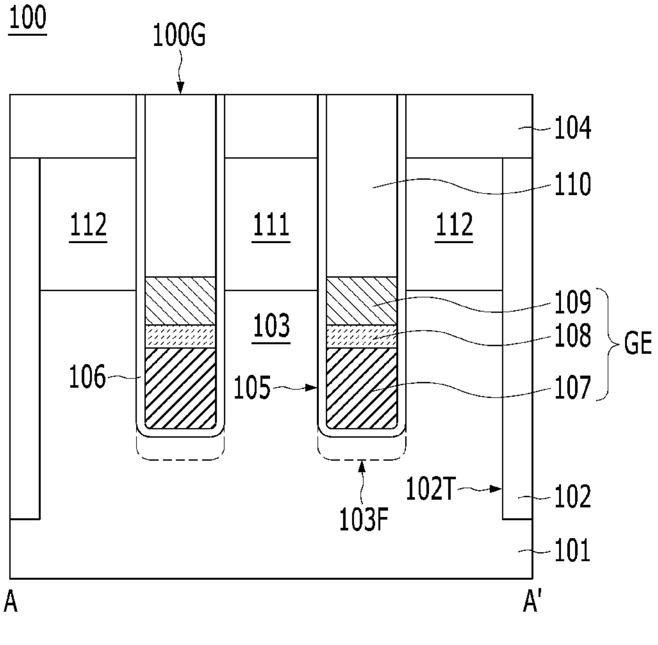
FIG. 2A is a diagram illustrating a semiconductor device according to a first embodiment, and is a cross-sectional view taken along line A-A' of FIG. 1.
Figure 2B:
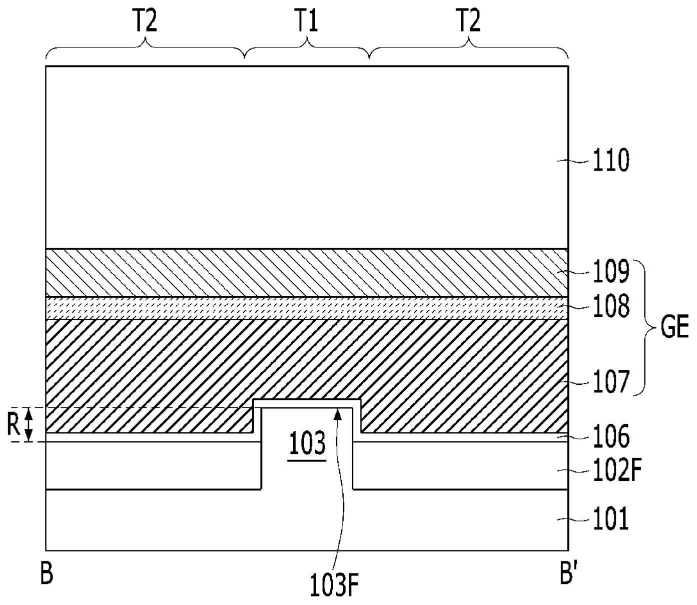
FIG. 2B is a diagram illustrating a semiconductor device according to the first embodiment, and is a cross-sectional view taken along line B-B' of FIG. 1.

FIG. 1 is a plan view of a semiconductor device according to an embodiment of the present invention. FIG. 2A is a diagram illustrating a semiconductor device according to a first embodiment, and is a cross-sectional view taken along line A-A' of FIG. 1. FIG. 2B is a diagram illustrating a semiconductor device according to the first embodiment, and is a cross-sectional view taken along line B-B' of FIG. 1.

As shown in FIGS. 1, 2A and 2B, the semiconductor device 100 may include a buried gate structure 100G, a first source/drain region 111, and a second source/drain region 112. A device isolation layer 102 and an active region 103 may be formed in the substrate 101. A first source/drain region 111 and a second source/drain region 112 may be formed in the active region 103. A trench crossing the active region 103 and the device isolation layer 102, that is the gate trench 105, may be formed. A buried gate structure 100G may be formed in the gate trench 105. A channel may be formed between the first source/drain region 111 and the second source/drain region 112 by the buried gate structure 100G. A channel may be defined along a profile of the gate trench 105. The semiconductor device 100 may be a part of a memory cell. For example, the semiconductor device 100 may be a cell transistor of a DRAM.

The semiconductor device 100 may be formed on a substrate 101. The substrate 101 may be a material suitable for semiconductor processing. The substrate 101 may include a semiconductor substrate. The substrate 101 may be made of a material containing silicon. The substrate 101 may include, for example, monocrystalline silicon, polysilicon, amorphous silicon, silicon germanium, monocrystalline silicon germanium, polycrystalline silicon germanium, carbon doped silicon, combinations thereof, or multiple layers thereof. The substrate 101 may include other semiconductor materials such as germanium. The substrate 101 may include a III/V group semiconductor substrate, for example, a compound semiconductor substrate such as GaAs. The substrate 101 may include a silicon on insulator (SOI) substrate.

A device isolation layer 102 and an active region 103 may be formed on the substrate 101. The active region 103 may be defined by the device isolation layer 102. The device isolation layer 102 may be a shallow trench isolation region (STI) formed by trench etching. The device isolation layer 102 may be formed by filling a dielectric material in a shallow trench, for example, an isolation trench 102T. The device isolation layer 102 may include, for example, silicon oxide, silicon nitride, or a combination thereof.

A gate trench 105 may be formed in the substrate 101. Viewed from the plan view of FIG. 1, the gate trench 105 may have a line shape extending in a first direction. The gate trench 105 may have a line shape crossing the active region 103 and the device isolation layer 102. The gate trench 105 may have a shallower depth than the isolation trench 102T. The bottom of the gate trench 105 may have a curvature. The gate trench 105 may have a flat bottom.

A first source/drain region 111 and a second source/drain region 112 may be formed in the active region 103. The first source/drain region 111 and the second source/drain region 112 are regions doped with a conductive dopant. For example, the conductive dopant may include phosphorus (P), arsenic (As), antimony (Sb), or boron (B). The first source/drain region 111 and the second source/drain region 112 may be doped with a dopant of the same conductivity type. A first source/drain region 111 and a second source/drain region 112 may be positioned in the active region 103 on both sides of the gate trench 105. Bottom surfaces of the first source/drain region 111 and the second source/drain region 112 may be positioned at a predetermined depth from a top surface of the active region 103. The first source/drain region 111 and the second source/drain region 112 may contact a sidewall surface the gate trench 105. Bottom surfaces of the first source/drain region 111 and the second source/drain region 112 may be higher than the bottom surface of the gate trench 105.

The gate trench 105 may include a first trench T1 and a second trench T2. The first trench T1 is formed in the active region 103. The second trench T2 is formed in the device isolation layer 102. The gate trench 105 may continuously extend from the first trench T1 to the second trench T2. In the gate trench 105, the first trench T1 and the second trench T2 may have bottom surfaces positioned at different levels. For example, the bottom surface of the first trench T1 may be located at a higher level than the bottom surface of the second trench T2. A height difference between the first trench T1 and the second trench T2 is formed as the device isolation layer 102 is recessed. Accordingly, the second trench T2 may include the recess region R having a lower bottom than that of the first trench T1. A fin 103F is formed in the active region 103 due to a step difference between the first trench T1 and the second trench T2. Accordingly, the active region 103 may include a fin 103F.

In this way, the fin 103F is formed under the first trench T1, and the sidewall surface of the fin 103F is exposed by the recessed device isolation layer 102F. The fin 103F is a portion where a channel is formed. The fin region 103F is referred to as a saddle fin. The fin region 103F may increase the channel width and improve the electrical characteristics of the semiconductor device.

In some embodiments, the fin region 103F may be omitted.

A buried gate structure 100G may be embedded in the gate trench 105. The buried gate structure 100G may be disposed in the active region 103 between the first source/drain region 111 and the second source/drain region 112 and extend into the device isolation layer 102. In the buried gate structure 100G, a bottom surface of a portion disposed in the active region 103 and a bottom surface of a portion disposed in the device isolation layer 102 may be located at different levels. When the fin 103F is omitted, in the buried gate structure 100G, a bottom surface of a portion disposed in the active region 103 and a bottom surface of a portion disposed in the device isolation layer 102 may be positioned at the same level.

The buried gate structure 100G may include a gate dielectric layer 106, a gate electrode structure GE, and a capping layer 110.

The gate dielectric layer 106 may be conformally formed on the bottom surface and sidewall surface of the gate trench 105. The gate dielectric layer 106 may include, for example, silicon oxide, silicon nitride, silicon oxynitride, a high-k material, or a combination thereof. The high-k material may include a material having a dielectric constant greater than that of silicon oxide. For example, the high-k material may include a material having a dielectric constant greater than 3.9. In another example, the high-k material may include a material having a dielectric constant greater than 10. In another example, the high-k material may include a material having a dielectric constant of 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. In some embodiments, the high-k material may include lanthanum oxide, lanthanum aluminum oxide, zirconium oxide, zirconium silicon oxide, zirconium silicon oxynitride, aluminum oxide, or a combination thereof. As the high-k material, other known high-k material may be selectively used. The gate dielectric layer 106 may include a metal oxide.

The upper surface of the gate electrode structure GE may be at a lower level than the upper surface of the active region 103. The gate electrode structure GE may include a stacked structure of a lower gate electrode 107 and an upper gate electrode 109. The gate electrode structure GE may further include a diffusion barrier layer 108 between the lower gate electrode 107 and the upper gate electrode 109.

The lower gate electrode 107 may include a metal nitride having a first grain size. The lower gate electrode 107 may include a metal nitride having a dense film quality. The lower gate electrode 107 may include a metal nitride that is free of voids or has very few voids in the film. To this end, the lower gate electrode 107 may include a metal nitride doped with silicon. For example, the lower gate electrode 107 may include, for example, silicon-doped titanium nitride (Si-doped TiN).

The upper gate electrode 109 may be a metal nitride including the same metal as the lower gate electrode 107. The upper gate electrode 109 may include a metal nitride having a second grain size larger than the first grain size. The upper gate electrode 109 may include a metal nitride including a low work function element and a film quality less dense than that of the lower gate electrode 107. That is, the upper gate electrode 109 may include a metal nitride including a low work function element and having more voids in the film than the lower gate electrode 107. The upper gate electrode 109 may include a metal nitride including a low work function element and a lower silicon content than the lower gate electrode 107. In another embodiment, the upper gate electrode 109 may include a metal nitride including a low work function element and not containing silicon. For example, the upper gate electrode 109 may include phosphorus (P) doped/diffused titanium nitride (P doped/diffused TiN). In some embodiments, the upper gate electrode 109 may be a metal-based material including a metal different from that of the lower gate electrode 107.

The diffusion barrier layer 108 may be a metal nitride, preferably including the same metal as the lower gate electrode 107 and the upper gate electrode 109. The diffusion barrier layer 108 may include a metal nitride having a third grain size smaller than the first grain size. The diffusion barrier layer 108 may be applied to prevent the low work function element in the upper gate electrode 109 from diffusing to the lower gate electrode 107. The diffusion barrier layer 108 may include a metal nitride having a denser film quality than that of the lower gate electrode 107. The diffusion barrier layer 108 may include a metal nitride formed by a physical vapor deposition (Physical Vapor Deposition) process. For example, the diffusion barrier layer 108 may include titanium nitride (PVD TiN) formed by PVD.

In some embodiments, the diffusion barrier layer 108 may be a metal-based material including a metal different from that of the lower gate electrode 107.

In some embodiments, the diffusion barrier layer 108 may be omitted. That is, the lower gate electrode 107 and the upper gate electrode 109 may directly contact each other.

The lower gate electrode 107 and the upper gate electrode 109 may have different work functions. The upper gate electrode 109 may have a work function lower than that of the lower gate electrode 107. The upper surface of the lower gate electrode 107 may be positioned at a level lower than the bottom surfaces of the first and second source/drain regions 111 and 112. The lower gate electrode 107 may not horizontally overlap the first and second source/drain regions 111 and 112. The bottom surface of the upper gate electrode 109 may be positioned at a level lower than the bottom surfaces of the first and second source/drain regions 111 and 112. The upper gate electrode 109 may horizontally overlap the first and second source/drain regions 111 and 112.

The capping layer 110 serves to protect the gate electrode structure GE. The capping layer 110 may include a dielectric material. The capping layer 110 may include, for example, silicon nitride, silicon oxynitride, or a combination thereof. In some embodiments, the capping layer 110 may include a combination of silicon nitride and silicon oxide. The capping layer 110 may include a silicon nitride liner and a spin on dielectric (SOD).

In this embodiment illustrated in FIGS. 1-2B, by forming the lower and upper gate electrodes 107 and 109 and the diffusion barrier layer 108 of the same metal material, the volume of metal in the gate electrode can be increased. Accordingly, the resistance Rs of the device may be reduced by reducing the specific resistance of the gate electrode.

In this embodiment, the grain size of the upper gate electrode 109 may be adjusted to be larger than the grain size of the lower gate electrode 107. Accordingly, it is possible to facilitate doping/diffusion of the low work function element into the upper gate electrode 109.

In this embodiment, the gate induced drain leakage (GIDL) is reduced by doping/diffusing the low work function control element in the upper gate electrode 109 horizontally overlapping the first and second source/drain regions 111 and 112.

FIGS. 3A to 31 are diagrams illustrating an embodiment of a method of forming the semiconductor device according to the first embodiment.

Figure 3A:
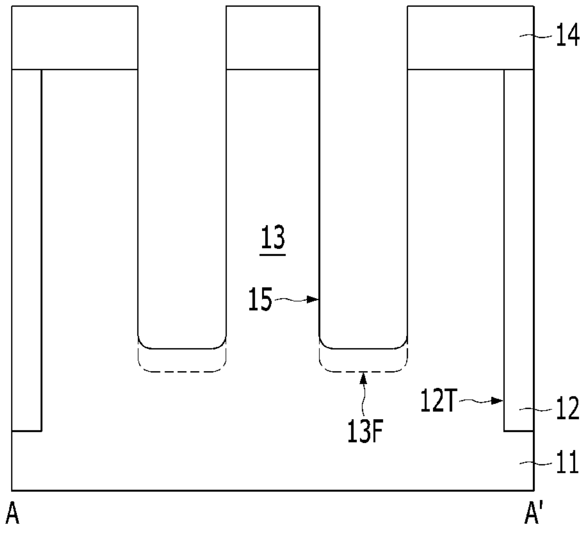

As shown in FIG. 3A, the device isolation layer 12 is formed in the substrate 11. An active region 13 is defined by the device isolation layer 12. The device isolation layer 12 may be formed by an STI process. For example, the substrate 11 is etched to form the isolation trench 12T. The isolation trench 12T is filled with a dielectric material, and thus the device isolation layer 12 is formed. The device isolation layer 12 may include, for example, silicon oxide, silicon nitride, or a combination thereof. A chemical vapor deposition (CVD) or other deposition process may be used to fill the isolation trench 12T with a dielectric material. A planarization process such as chemical-mechanical polishing (CMP) may additionally be used.

A gate trench 15 is formed in the substrate 11. The gate trench 15 may be formed in a line shape crossing the active region 13 and the device isolation layer 12. The gate trench 15 may be formed by an etching process using hard mask 14 as an etching mask. The hard mask 14 may be formed on the substrate 11 and may have line-shaped openings spaced apart from each other. The hard mask 14 may be formed of a material having an etch selectivity with respect to the substrate 11. The hard mask 14 may be made, for example, of silicon oxide such as tetra ethyl ortho silicate (TEOS). The gate trench 15 may be formed to be shallower than the isolation trench 12T. The depth of the gate trench 15 may have a sufficient depth such that it may adequately increase the average cross-sectional area of a subsequent gate electrode and, thus, effectively reduce the resistance of the gate.

The bottom of the gate trench 15 may be flat or may have a curvature.

Figure 3B:
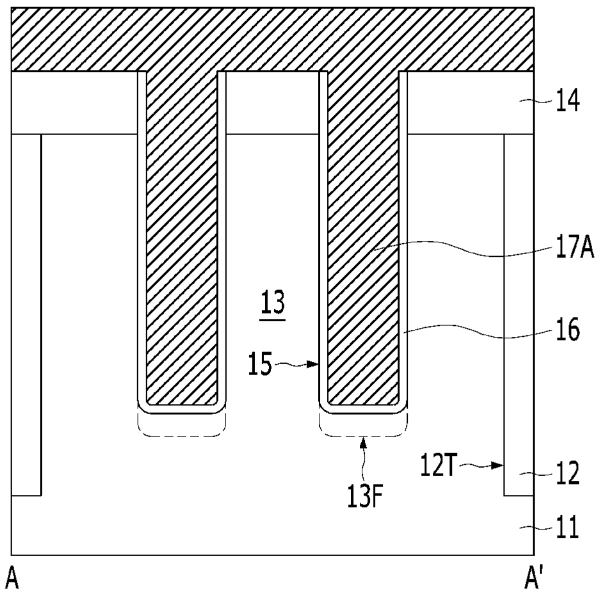

Subsequently, a fin 13F may be formed. In order to form the fin 13F, the isolation layer 12 under the gate trench 15 may be recessed. The fin 13F refers to the fin 13F shown in FIG. 2B. As shown in FIG. 3B, a gate dielectric layer 16 may be formed on the surfaces of the gate trench 15 and the hard mask 14. Before the gate dielectric layer 16 is formed, any etch damage on the surface of the gate trench 15 may be cured. For example, a sacrificial oxide may be formed by thermal oxidation, and the sacrificial oxide may be removed.

The gate dielectric layer 16 may be formed by a thermal oxidation process. The gate dielectric layer 16 may be formed by chemical vapor deposition (CVD) or atomic layer deposition (ALD). The gate dielectric layer 16 may include a high-k material, oxide, nitride, oxynitride, or a combination thereof. The high-k material may include a hafnium-containing material. The hafnium-containing material may include hafnium oxide, hafnium silicon oxide, hafnium silicon oxynitride, or a combination thereof. In some embodiments, the high-k material may include lanthanum oxide, lanthanum aluminum oxide, zirconium oxide, zirconium silicon oxide, zirconium silicon oxynitride, aluminum oxide, or a combination thereof. As the high-k material, other known high-k material may be selectively used. The gate dielectric layer 16 may include a material having a high oxygen atomic density.

A lower gate electrode layer 17A may be formed on the gate dielectric layer 16. The lower gate electrode layer 17A may fill the gate trench 15. The lower gate electrode layer 17A may include a metal nitride having a first grain size. The lower gate electrode layer 17A may include a metal nitride having a dense film quality. The lower gate electrode layer 17A may include void-free or void-less metal nitride in the film.

For example, the lower gate electrode layer 17A may include a metal nitride doped with silicon. For example, the lower gate electrode layer 17A may include silicon-doped titanium nitride (Si-doped TiN). The lower gate electrode layer 17A may be formed by a chemical vapor deposition process or an atomic layer deposition process.

Figure 3C:
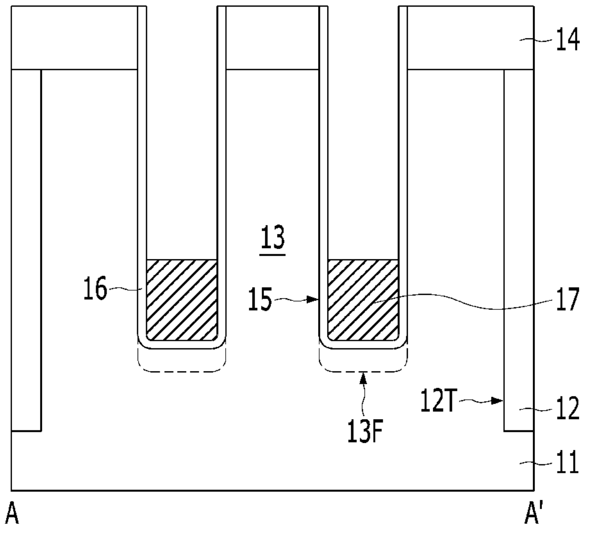

As shown in FIG. 3C, a lower gate electrode 17 filling a lower portion (referred to herein as the bottom) of the gate trench may be formed. To form the lower gate electrode 17, a recessing process may be performed. The recessing process may be performed by dry etching, for example, an etch-back process. Hence, in some embodiments, the lower gate electrode 17 may be formed by an etch-back process removing the lower gate electrode layer 17A. In some embodiments, during the recessing process, a planarization process may be performed first for exposing a top surface of the hard mask 14, and then an etch-back process may be subsequently performed.

Figure 3D:
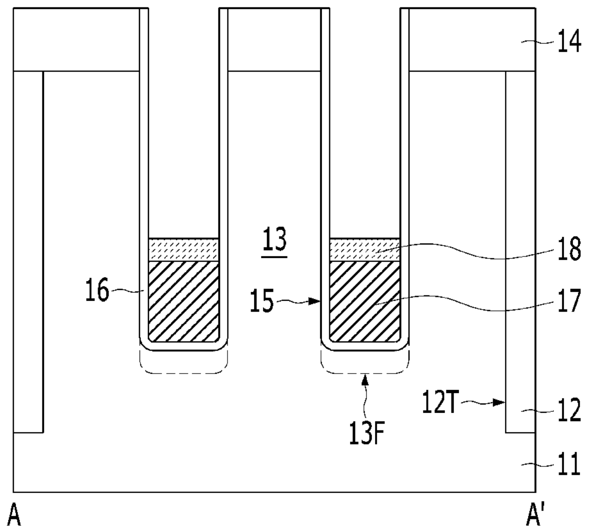

As shown in FIG. 3D, a diffusion barrier layer 18 may be formed over the lower gate electrode 17. For example, the diffusion barrier layer 18 may be formed directly on the lower gate electrode 17 and may cover an entire top surface of the lower gate electrode 17. The diffusion barrier layer 18 may be made of any suitable material including, for example, a metal nitride including a same metal as the one that may be used for making the lower gate electrode 17. The diffusion barrier layer 18 may be used to prevent a low work function element in the upper gate electrode from diffusing to the lower gate electrode 17 in a subsequent process. The diffusion barrier layer 18 may in some embodiments be made of a metal nitride having a denser film quality than that of the lower gate electrode 17. The grain size of the diffusion barrier layer 18 may be smaller than the grain size of the lower gate electrode 17. The diffusion barrier layer 18 may be made of a metal nitride that is formed, for example, by a physical vapor deposition process. For example, the diffusion barrier layer 18 may include titanium nitride (PVD TiN) formed by PVD.

In some embodiments, the diffusion barrier layer 18 may be a metal-based material including a metal different from that of the lower gate electrode 17. In some embodiments, the diffusion barrier layer 18 may be omitted.

Figure 3E:
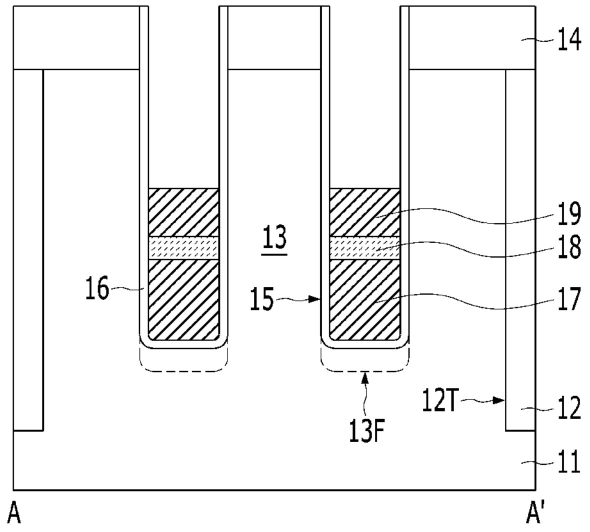

As shown in FIG. 3E, the upper gate electrode 19 may be formed directly on the diffusion barrier layer 18 and cover an entire top surface of the diffusion barrier layer 18. The upper gate electrode 19 may be formed through a series of processes in which a recessing process is performed after the forming of an upper gate electrode layer that is filling the gate trench 15 on the diffusion barrier layer 18. The recessing process may be performed by dry etching, for example, an etch-back process.

Figure 3F:
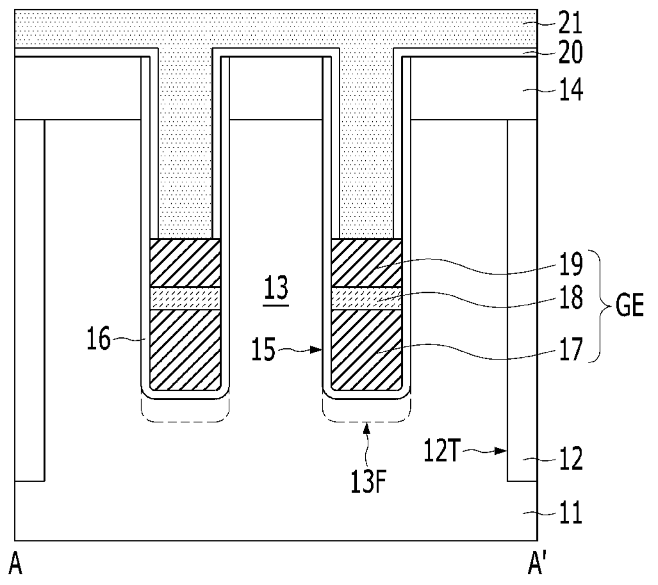

The upper gate electrode 19 may be a metal nitride including the same metal as the lower gate electrode 17. The upper gate electrode 19 may include a metal nitride having a second grain size larger than the first grain size. The upper gate electrode 19 may include a metal nitride whose film quality is less dense than that of the lower gate electrode 17. That is, the upper gate electrode 19 may include a metal nitride having more voids in the film than the lower gate electrode 17. To this end, the upper gate electrode 19 may include a metal nitride having a lower amount of silicon than that of the lower gate electrode 17 or a metal nitride not containing silicon. In some embodiments, the upper gate electrode 19 may be a metal-based material including a metal different from that of the lower gate electrode 17. As shown in FIG. 3F, a buffer layer 20 may be formed on the sidewall surface the gate dielectric layer 16 exposed over the upper gate electrode 19 and on the hard mask 14. The buffer layer 20 may serve as an etch stop layer. The buffer layer 20 may include a material having an etch selectivity with respect to the gate dielectric layer 16 and the hard mask 14. The buffer layer 20 may include a dielectric material. The buffer layer 20 may include a material that is easy to remove.

In some embodiments, the buffer layer 20 may be omitted. Subsequently, a sacrificial layer 21 filling the gate trench 15 may be formed on the upper gate electrode 19. The sacrificial layer 21 may be made of a material layer including a low work function element. For example, the low work function element may include phosphorus (P). For example, the sacrificial layer 21 may be PSG (Phosphorus Silicate Glass).

Figure 3G:
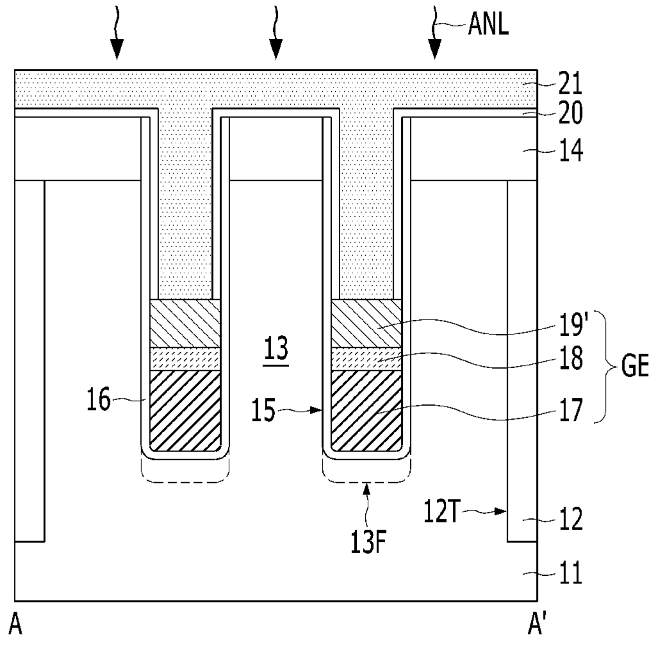
Figure 3H:
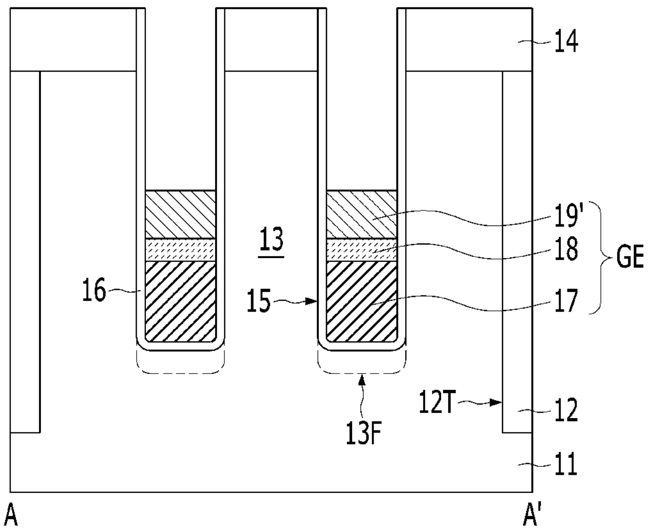
Figure 3I:
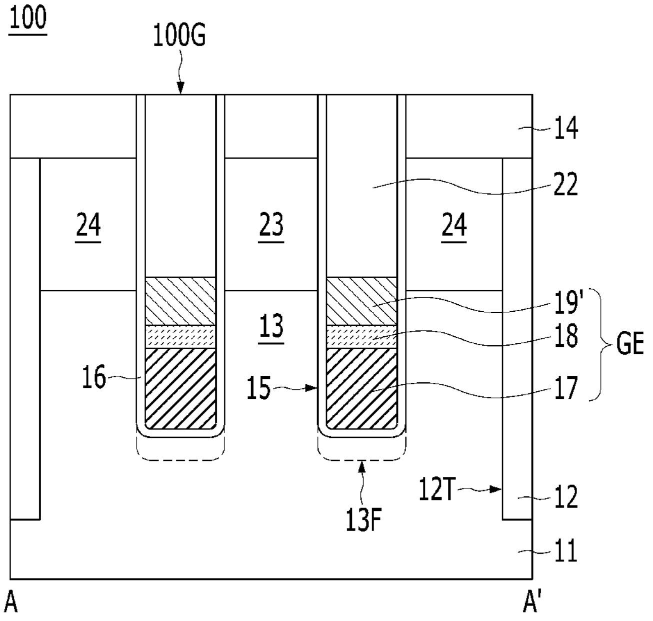

As shown in FIGS. 3G and 3H, an annealing process (ANL) may be performed on the structure of FIG. 3F. The low work function element in the sacrificial layer 21 may be diffused into the upper gate electrode 19' by the annealing process. The upper gate electrode 19 including the low work function element will be referred hereinafter also as an 'upper gate electrode 19'. The work function of the upper gate electrode 19' may be lower than the work function of the lower gate electrode 17.

In this embodiment, by adjusting the grain size of the upper gate electrode 19' to be larger than the grain size of the lower gate electrode 17, the diffusion of the low work function element from the sacrificial layer 21 to the upper gate electrode 19' may be facilitated.

In addition, the upper gate electrode 19' may be formed of titanium nitride having no silicon or having a lower silicon content than that of the lower gate electrode 17, so that the crystal grain size of the titanium nitride increases during an annealing process, resulting in an increase in the voids in the film. Accordingly, diffusion of the low work function element from the sacrificial layer 21 to the upper gate electrode 19' may be facilitated.

Subsequently, the sacrificial layer 21 and the buffer layer 20 may be removed.

As shown in FIG. 31, a capping layer 22 filling the remainder of the gate trench 15 is formed on the upper gate electrode 19' in direct contact with an entire top surface of the upper gate electrode 19'. The capping layer 22 may be formed through a series of processes of forming a dielectric material filling the gate trench 15 on the upper gate electrode 19' and planarizing the dielectric material so that a top surface of the hard mask 14 is exposed.

The capping layer 22 includes a dielectric material. The capping layer 22 may include, for example, silicon nitride. In some embodiments, the capping layer 22 may include, for example, silicon nitride, silicon oxynitride, or a combination thereof. In some embodiments, the capping layer 22 may include a silicon nitride liner and a spin on dielectric (SOD) material. In some embodiments, the capping layer 22 may have an oxide-nitride-oxide (ONO) structure.

A buried gate structure 100G is formed by a series of processes as described above. The buried gate structure 100G may include a gate dielectric layer 16, a gate electrode structure GE, and a capping layer 22.

Subsequently, an impurity doping process may be performed, for example by implantation or by other doping technique. Accordingly, a first source/drain region 23 and a second source/drain region 24 are formed in the substrate 11. The first source/drain region 23 and the second source/drain region 24 may horizontally overlap part or all of the upper gate electrode 19'. The lower gate electrode 17 may not horizontally overlap the first and second source/drain regions 23 and 24.

As the first and second source/drain regions 23 and 24 are formed, a channel may be defined along the surface of the gate trench 15.

Figure 4A:
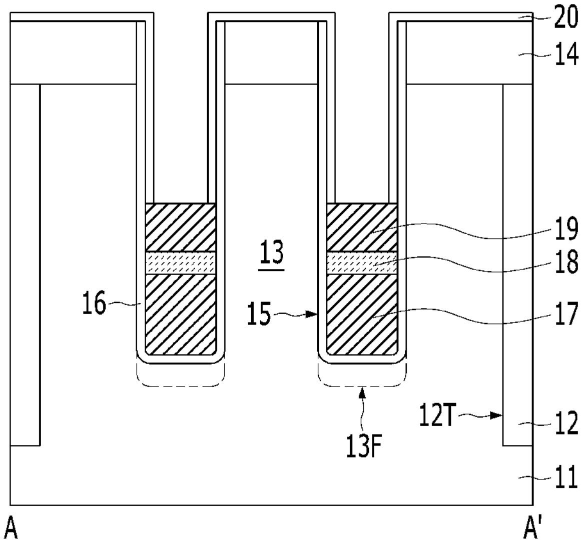
FIGS. 4A to 4C are diagrams illustrating some embodiments of a method of forming the semiconductor device according to the first embodiment.
Figure 4B:
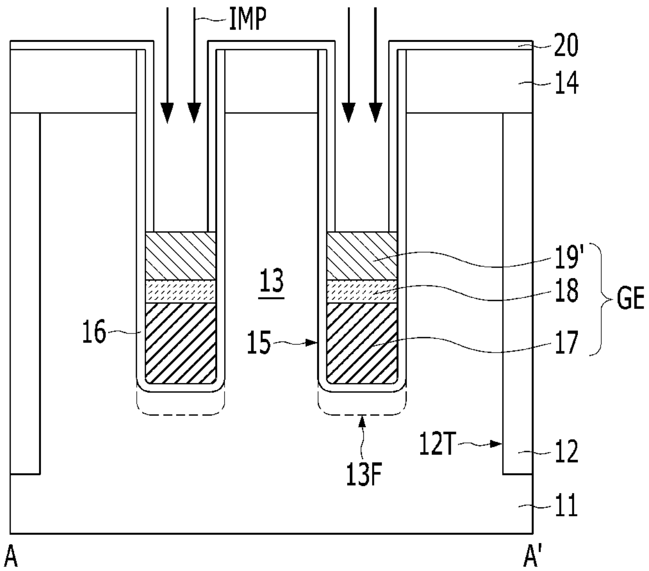
Figure 4C:
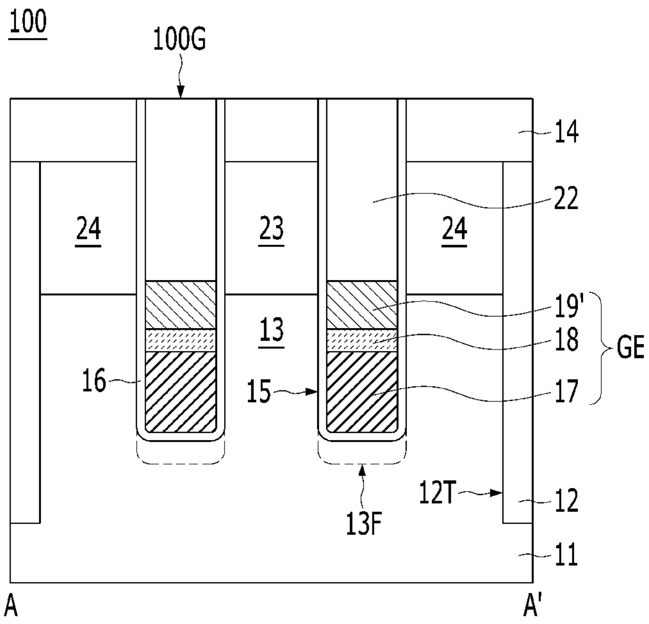

FIGS. 4A to 4C are diagrams illustrating some embodiments of a method of forming the semiconductor device according to the first embodiment.

First, a gate dielectric layer 16, a lower gate electrode 17, a diffusion barrier layer 18, and an upper gate electrode 19 may be formed in the gate trench 15 by the method shown in FIGS. 3A to 3E.

Next, as shown in FIG. 4A, a buffer layer 20 may be formed on the sidewall surface of the gate dielectric layer 16 exposed over the upper gate electrode 19 and on the hard mask 14. The buffer layer 20 may include a dielectric material. The buffer layer 20 may be formed through a series of processes of conformally forming a dielectric material along an entire surface including the upper gate electrode 19 and then etching the dielectric material to expose the upper surface of the upper gate electrode 19. In this case, the buffer layer 20 on the hard mask 14 may be partially lost or removed by the etching together with the dielectric material.

As shown in FIG. 4B, a doping process (IMP) using a low work function element may be performed. Accordingly, the upper gate electrode 19' doped with the low work function element is formed. For example, the low work function element may include phosphorus (P). Accordingly, the upper gate electrode 19' may be titanium nitride doped with phosphorus (P doped TiN).

In this embodiment, by adjusting the grain size of the upper gate electrode 19' to be larger than the grain size of the lower gate electrode 17, intra-film diffusion of the low work function element doped into the upper gate electrode 19' by the doping process (IMP) may be facilitated. In this case, the diffusion of the low work function element to the low gate electrode 17 may be prevented by the diffusion barrier layer 18 having a small grain size and dense film quality under the upper gate electrode 19'.

In some embodiments, to form the upper gate electrode 19' doped with a low work function element, a series of processes of flowing a phosphorus (P) gas at a high temperature in a furnace or a deposition equipment followed by performing rapid thermal treatment (RTA) may be performed.

As shown in FIG. 4C, a capping layer 22 filling the remainder of the gate trench 15 is formed on the upper gate electrode 19'. The capping layer 22 may be formed through a series of processes of forming a dielectric material filling the gate trench 15 on the upper gate electrode 19' and planarizing the dielectric material so that the top surface of the hard mask 14 is exposed.

The capping layer 22 includes a dielectric material. The capping layer 22 may include, for example, silicon nitride. In some embodiments, the capping layer 22 may include, for example, silicon nitride, silicon oxynitride, or a combination thereof. In some embodiments, the capping layer 22 may include a silicon nitride liner and a spin on dielectric (SOD) material. In some embodiments, the capping layer 22 may have an oxide-nitride-oxide (ONO) structure.

A buried gate structure 100G is formed by a series of processes as described above. The buried gate structure 100G may include a gate dielectric layer 16, a gate electrode structure GE, and a capping layer 22.

An impurity doping process may be performed, for example, by implantation or other doping technique. Accordingly, a first source/drain region 23 and a second source/drain region 24 are formed in the substrate 11. The first source/drain region 23 and the second source/drain region 24 may horizontally overlap part or all of the upper gate electrode 19'. The lower gate electrode 17 may not horizontally overlap the first and second source/drain regions 23 and 24.

As the first and second source/drain regions 23 and 24 are formed, a channel may be defined along the surface of the gate trench 15.

Various embodiments have been described as examples of the present invention disclosure addressing the aforementioned problems of the prior art, but it will be apparent to those skilled in the art that various changes and modifications can be made within the scope and the technical spirit of the present invention as defined in the appended claims.

What is claimed is:

1. A semiconductor device comprising:

a substrate including a trench;

a gate dielectric layer formed along a sidewall surface and a bottom surface of the trench;

a lower gate electrode filling a lower portion of the trench over the gate dielectric layer and formed of a first metal nitride, the first metal nitride having a first grain size;

an upper gate electrode partially filling the trench over the lower gate electrode and formed of a second metal nitride, the second metal nitride containing, as a dopant, a low work function control element, the second metal nitride having a second grain size bigger than the first grain size, wherein the first and second metal nitrides include titanium nitride containing silicon, and a silicon content of the second metal nitride is lower than a silicon content of the first metal nitride; and a capping layer gap-filling the remainder of the trench over the upper gate electrode.

2. The semiconductor device of claim 1, wherein the first and second metal nitrides include a same metallic material.

3. The semiconductor device of claim 1, wherein the low work function control element includes phosphorus.

4. The semiconductor device of claim 1, further including a diffusion barrier layer disposed between the lower gate electrode and the upper gate electrode.

5. The semiconductor device of claim 4, wherein the diffusion barrier layer includes a third metal nitride, the third metal nitride having a third grain size which is smaller than the first grain size.

6. The semiconductor device of claim 5, wherein the third metal nitride includes a same metallic material as the first and second metal nitrides.

7. Semiconductor device of claim 1, further including a source/drain region formed on the substrate disposed on both sides of the trench.

8. A semiconductor device comprising:

a substrate including a gate trench;

a gate dielectric layer formed along a sidewall surface and a bottom surface of the gate trench;

a lower gate electrode filling a lower portion of the gate trench over the gate dielectric layer and formed of a first metal nitride, the first metal nitride having a first grain size and containing silicon, the first metal nitride including titanium nitride;

an upper gate electrode partially filling the gate trench over the lower gate electrode and formed of a second metal nitride, the second metal nitride containing, as a dopant, a low work function control element, the second metal nitride having a lower silicon content than a silicon content of the first metal nitride, the second metal nitride including titanium nitride containing silicon; and a capping layer gap-filling the remainder of the gate trench over the upper gate electrode.

9. The semiconductor device of claim 8, wherein the first and second metal nitrides include a same metallic material.

10. The semiconductor device of claim 8, wherein the low work function control element includes phosphorus.

11. The semiconductor device of claim 8, further including a diffusion barrier layer disposed between the lower gate electrode and the upper gate electrode.

12. The semiconductor device of claim 11, wherein the diffusion barrier layer includes a third metal nitride having a denser film quality than film qualities of the lower gate electrode and the upper gate electrode.

13. The semiconductor device of claim 12, wherein the third metal nitride includes a same metallic material as the first and second metal nitrides.

14. The semiconductor device of claim 8, further including a source/drain region formed on the substrate disposed on both sides of the gate trench.

15. The semiconductor device of claim 8, wherein an upper surface of the lower gate electrode is disposed at a lower level than a bottom surface of the source/drain region.

16. The semiconductor device of claim 8, wherein the source/drain region horizontally overlaps part or all of the upper gate electrode.

* * * * *